(12) United States Patent
Okayama

(10) Patent No.: US 8,064,490 B2
(45) Date of Patent: Nov. 22, 2011

(54) OPTICAL RESONATOR AND TUNABLE LASER

(75) Inventor: Hideaki Okayama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/458,686

(22) Filed: Jul. 20, 2009

(65) Prior Publication Data

US 2010/0085991 A1 Apr. 8, 2010

(30) Foreign Application Priority Data

Oct. 7, 2008 (JP) .................................. 2008-260896

(51) Int. Cl.
*H01S 3/10* (2006.01)
(52) U.S. Cl. .................................. 372/20; 372/23; 372/6
(58) Field of Classification Search .................... 372/20, 372/23, 6

See application file for complete search history.

(56) References Cited

U.S. PATENT DOCUMENTS

| | | | |
|---|---|---|---|
| 5,388,001 A * | 2/1995 | Okayama et al. ............. | 359/629 |
| 6,400,483 B1 * | 6/2002 | Mueller-Fiedler et al. .... | 398/194 |
| 6,570,893 B1 * | 5/2003 | Libatique et al. .............. | 372/20 |
| 2008/0056313 A1 * | 3/2008 | Yamazaki ....................... | 372/28 |

FOREIGN PATENT DOCUMENTS

| | | |
|---|---|---|
| JP | 10-261837 A | 9/1998 |
| JP | 2000-223744 A | 8/2000 |
| JP | 2000-261086 A | 9/2000 |
| JP | 2002-006352 A | 1/2002 |
| JP | 2004-071809 A | 3/2004 |
| JP | 2005-327881 A | 11/2005 |
| JP | 2006-196554 A | 7/2006 |
| JP | 2007-115900 A | 5/2007 |
| JP | 2007-234786 A | 9/2007 |

OTHER PUBLICATIONS

Takahashi et al., "Tunable Lasers Based on Silica Waveguide Ring Resonators", *Optical Fiber Communication Conference Papers* 2008, OWJ1.

* cited by examiner

*Primary Examiner* — Kinam Park
(74) *Attorney, Agent, or Firm* — Rabin & Berdo, P.C.

(57) ABSTRACT

An optical resonator has a Y-branched waveguide including first, second, and third optical waveguides interconnected at a single point. The first optical waveguide leads toward a reflector. The second and third optical waveguides are optically interconnected by a curved extension of the second and third optical waveguides, or by an independent ring waveguide to which the second and third optical waveguides are directionally coupled. At least one wavelength selector such as a Mach-Zehnder interferometer is formed in one or both of the second and third optical waveguides. This optical resonator is small in size and can be tuned by means of a single parameter. A tunable laser can be formed by inserting an optical amplifier between the first optical waveguide and the reflector.

12 Claims, 8 Drawing Sheets

OPTICAL RESONATOR AND TUNABLE LASER

BACKGROUND OF THE INVENTION

1. Field of the Invention

The present invention relates to an optical resonator and a tunable laser.

2. Description of the Related Art

Tunable lasers are widely used to generate light of different wavelengths in wavelength division multiplexed communication systems, because they enable a single device to handle a plurality of wavelengths. Numerous tunable laser structures have been proposed, as disclosed in, for example, Japanese Patent Application Publications No. H10-261837, 2000-261086, 2000-223744, 2005-327881, 2002-6352, 2004-71809, 2006-196554, 2007-115900, and 2007-234786, and by Takahashi et al. in 'Tunable Lasers Based on Silica Waveguide Ring Resonators', *Optical Fiber Communication Conference Papers* 2008, OWJ1.

A common feature of the tunable lasers in these disclosures is that they include a semiconductor optical amplifier and a tunable filter in an optical resonator.

Three requirements are now being imposed on tunable lasers: small size, a small number of components, and easy optical alignment. The tunable laser proposed by Takahashi et al., which employs an optical waveguide structure, is attracting attention as a way of meeting these requirements.

The tunable laser disclosed by Takahashi et al. uses two ring resonators with different free spectral ranges, and enables the wavelength to be tuned by the Vernier effect of the wavelength transmission peak. A ring resonator for supplying a reference wavelength is also included; used together with the Vernier effect, it enables the wavelength band of the selected light to be varied over a comparatively wide range of fifty nanometers (50 nm) with only a slight change in refractive index. This tunable laser is made from materials with a high refractive index, so the radius of curvature of the optical waveguide can be small enough to reduce the laser device to a square measuring about five millimeters (5 mm) on each side.

The resonant wavelengths of the two ring resonators in the tunable laser disclosed by Takahashi et al. must, however, be precisely controlled, requiring a complex control circuit. There is moreover a need for an optical resonator even smaller than the optical resonators in the tunable laser disclosed by Takahashi et al.

SUMMARY OF THE INVENTION

An object of the present invention is to provide a simpler way to control wavelength through use of a single parameter, more specifically through the use of a refractive index parameter.

Another object of the invention is to provide an optical resonator and tunable laser with reduced size.

These objects are attained by a novel optical resonator having first, second, and third optical waveguides with ends interconnected at a single point to form a Y-branch. The first waveguide is terminated at its other end by a reflector. One or both of the second and third waveguides includes a wavelength selector. The second and third waveguides are optically coupled by an optical connecting path disposed between their other (terminal) ends.

The optical connecting path may be a curved optical waveguide that interconnects the terminal ends of the second and third waveguides, so that the curved optical waveguide and the second and third optical waveguides form a loop optical waveguide.

Alternatively, the optical connecting path may itself be a loop optical waveguide, to which the terminal ends of the second and third waveguides are optically coupled. These optical couplings may be directional couplings formed by a first part of the loop optical waveguide that passes adjacent to the terminal end of the second optical waveguide, and a second part of the loop optical waveguide that passes adjacent to the terminal end of the second optical waveguide.

The wavelength selector may be a Mach-Zehnder interferometer.

The optical resonator may include n Mach-Zehnder interferometers, where n is an integer greater than one. If the two arms of the i-th Mach-Zehnder interferometer differ in optical path length by a quantity $\Delta Li$ ($i=1, \ldots, n$), and an electrode of length $Lei$ is placed on one of the two arms, then the quantities $\Delta Li$ and $Lei$ may double in each successive Mach-Zehnder interferometer, so that:

$$\Delta Li = \Delta L1 \times 2^{i-1}$$

$$Lei = Le1 \times 2^{i-1}$$

The first n-1 Mach-Zehnder interferometers may be placed on the second optical waveguide and the n-th Mach-Zehnder interferometer may be placed on the third optical waveguide.

A novel tunable laser is made by inserting an optical amplifier between the terminal end of the first optical waveguide and the reflector, which may be a reflective coating on the optical amplifier.

The novel optical resonator and tunable laser can be made smaller than was possible in the prior art, and permits the resonant or lasing wavelength to be controlled by refractive index alone.

DETAILED DESCRIPTION OF THE INVENTION

Figure 1:
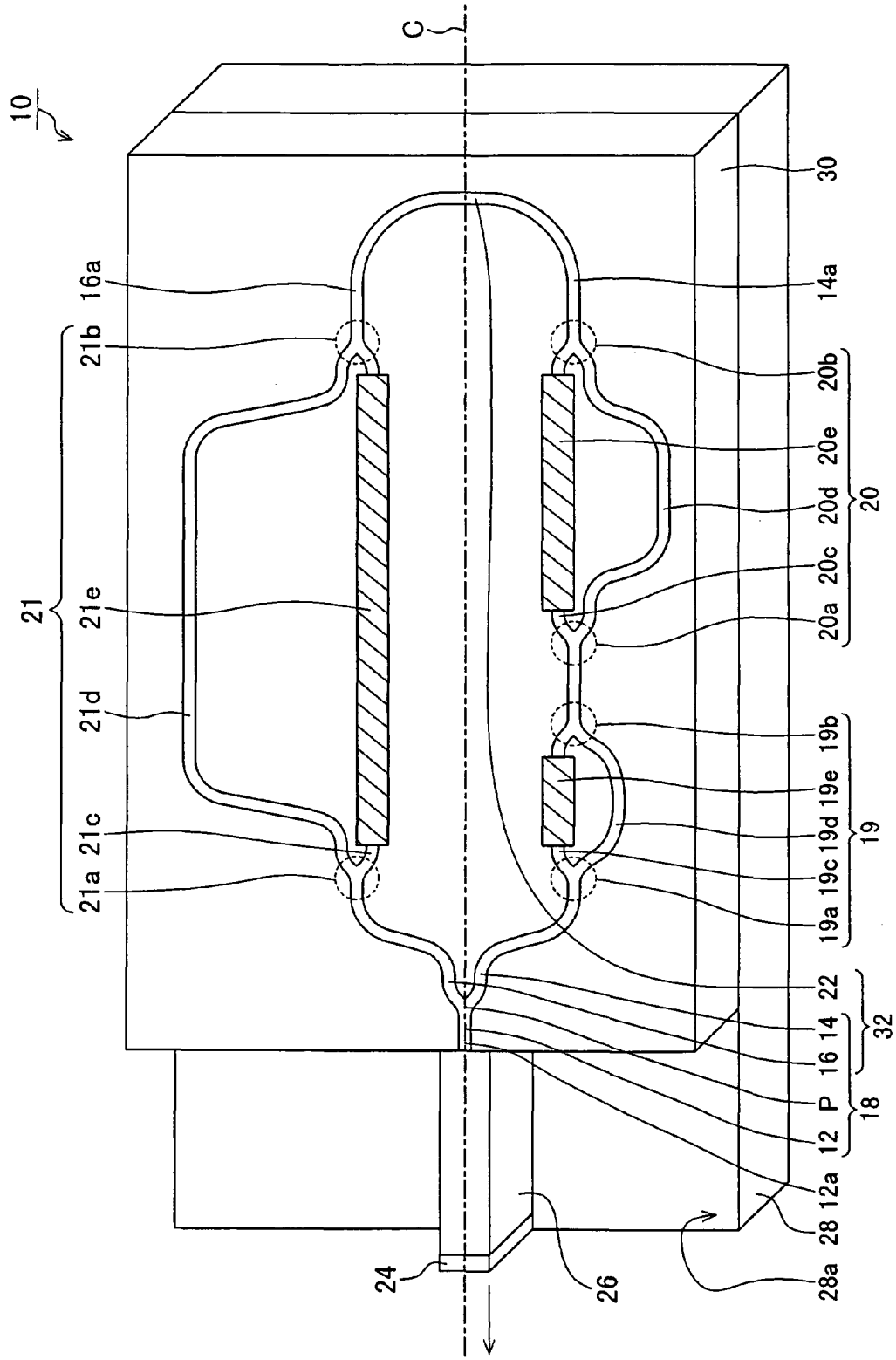
FIG. 1 is a schematic perspective view of an optical resonator in a first embodiment of the invention.

Embodiments of the invention will now be described with reference to the attached non-limiting drawings, in which like elements are indicated by like reference characters.

First Embodiment

Figure 2:
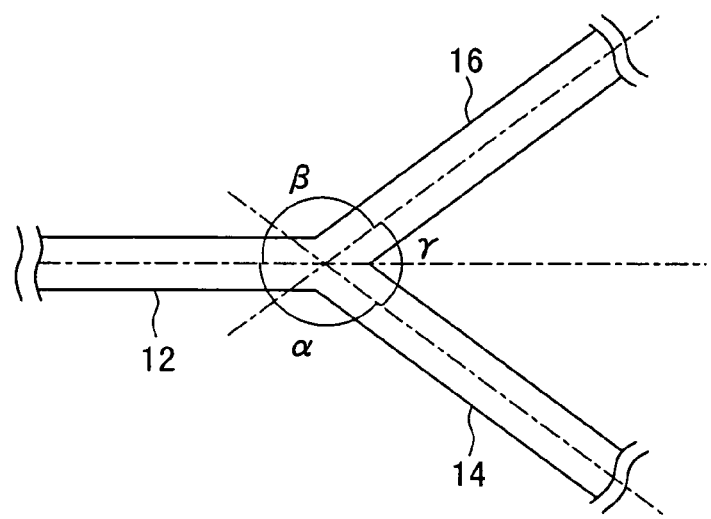
FIG. 2 is an enlarged plan view of point P in FIG. 1.
Figure 3:
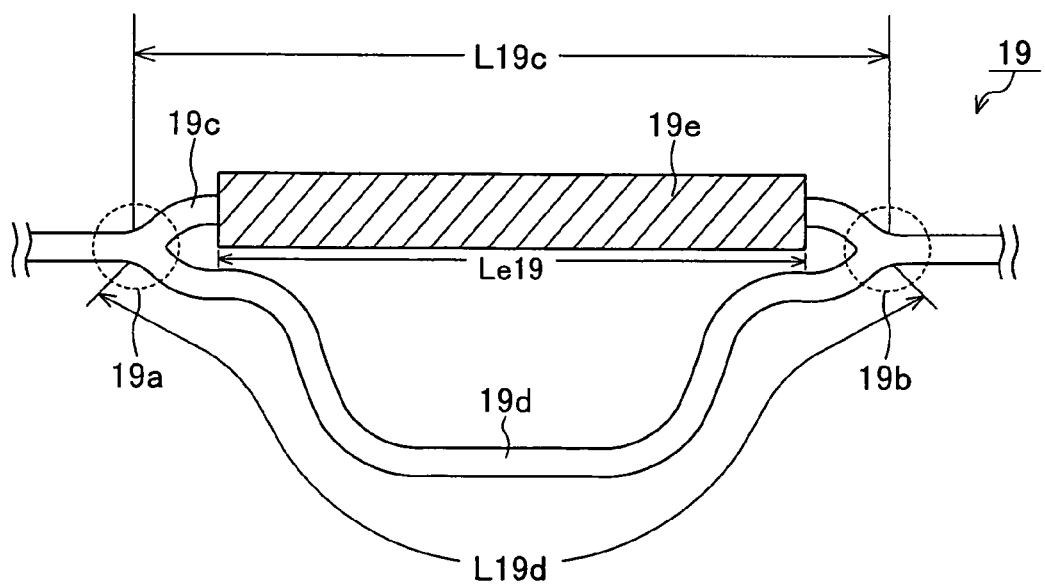
FIG. 3 is an enlarged plan view of the first Mach-Zehnder interferometer in FIG. 1.

The first embodiment provides an optical resonator and a tunable laser with the structure illustrated in FIGS. 1 to 3.

Referring to FIG. 1, the optical resonator 10 includes three optical waveguides 12, 14, 16 that meet at a point P to form a Y-branched waveguide 18. The second optical waveguide 14 includes first and second Mach-Zehnder interferometers 19 and 20. The third optical waveguide 16 includes a third Mach-Zehnder interferometer 21. The terminal ends 14a and 14b of the second and third optical waveguides 12 and 14 (the ends distant from point P) are joined by a curved optical waveguide 22.

To function as a tunable laser, the optical resonator 10 also includes a reflector 24 and a semiconductor optical amplifier 26 disposed between the reflector 24 and the first optical waveguide 12.

The optical resonator 10 is formed as an integrated device on a major surface 28a of a substrate 28. The reflector 24 and semiconductor optical amplifier 26 are formed directly on the major surface 28a. The Y-branched waveguide 18, including the Mach-Zehnder interferometers 19, 20, 21, and the curved optical waveguide 22 are embedded in a silicon dioxide film 30 deposited on the major surface 28a. For clarity, the Y-branched waveguide 18 and curved optical waveguide 22 are indicated by solid lines even though they are interior to the silicon dioxide film 30 and are not exposed on the surface of the silicon dioxide film 30.

It will be appreciated that the structure shown in FIG. 1 is just one example of a more general configuration in which there are n Mach-Zehnder interferometers, where n may be any integer greater than unity. The Mach-Zehnder interferometers may be divided between the second and third optical waveguides 14, 16 in any way, or all of the Mach-Zehnder interferometers may be placed on just one of the second and third optical waveguides.

The component elements of the optical resonator 10 will now be described in more detail.

The substrate 28 is preferably a flat rectangular substrate. One preferred material from which the substrate 28 may be made is silicon.

The reflector 24 is a known dielectric multilayer film with a reflectivity of at least 90% but less than 100%. One preferred type of reflector 24 comprises alternating layers of silicon nitride (SiN) and silicon dioxide ($SiO_2$). The reflector 24 is formed as a coating on the end of the semiconductor optical amplifier 26 from which light is to be output from the optical resonator 10.

The semiconductor optical amplifier 26 is a known semiconductor laser light source comprising a light-emitting active layer sandwiched between a p-type clad layer and an n-type clad layer (these layers are not shown). Some or all of these layers may be made from compound semiconductor materials. One preferred material from which the active layer may be made is indium gallium arsenide phosphide (InGaAsP), which emits light with a wavelength of 1.55 μm. Light is emitted when current is supplied to the semiconductor optical amplifier 26 through electrodes (not shown).

The semiconductor optical amplifier 26 emits light from both ends. At one end, light is emitted through the reflector 24. Light emitted from the other end of the semiconductor optical amplifier 26 is coupled into the first optical waveguide 12.

The silicon dioxide film 30 deposited on the major surface 28a of the substrate 28 has a flat rectangular shape and a size smaller than the size of the substrate 28. The silicon dioxide film 30 functions as a cladding with respect to the embedded Y-branched waveguide 18, including the Mach-Zehnder interferometers 19, 20, 21, and the embedded curved optical waveguide 22.

The optical waveguides 12, 14, 16 embedded in the silicon dioxide cladding film 30 that form the Y-branched waveguide 18 are preferably silicon waveguides. Each of these waveguides preferably has a square cross sectional shape with height and width dimensions of, for example, 0.3 μm. The height dimension is orthogonal to the major surface 28a of the substrate 28 and orthogonal to the direction of light propagation in the waveguide. The width dimension is parallel to the major surface 28a of the substrate 28 and orthogonal to the direction of light propagation.

The first optical waveguide 12 extends in a straight line from its initial end at point P to its terminal end 12a, which faces the active layer of the semiconductor optical amplifier 26. The terminal end 12a of the first optical waveguide 12 is preferably disposed so that its optical field distribution matches the optical field distribution of the active layer in the semiconductor optical amplifier 26. The terminal end 12a of the first optical waveguide 12 may be separated from the active layer by a suitable distance, such as a few micrometers, provided this distance is small enough to permit optical coupling.

The second and third optical waveguides 14 and 16 branch symmetrically from point P. The branching angle is exaggerated for clarity in the drawings. The central axes of the three waveguides form angles $\alpha$, $\beta$, $\gamma$ as shown in FIG. 2. The angle $\gamma$ between the longitudinal axes of the second and third waveguides 14 and 16 is preferably about 0.5 degrees. The angles $\alpha$, $\beta$ between the longitudinal axes of the second and third waveguides 14 and 16 and the longitudinal axis of the first optical waveguide 12 is preferably about 0.25 degrees. With these angles, all of the light propagating through the second optical waveguide 14 (or the third optical waveguide 16) toward point P propagates into the first optical waveguide 12 and is not diverted into the third optical waveguide 16 (or second optical waveguide 14).

Referring again to FIG. 1, if the presence of the Mach-Zehnder interferometers is ignored, the second and third optical waveguides 14 and 16 are mutually symmetric with respect to a line C forming an extension of the axis of the first optical waveguide 12. The second and third optical waveguides 14 and 16 accordingly have the same optical path length.

The second and third optical waveguides 14 and 16 both branch away from point P in an S-pattern, then extend straight, parallel to line C, out to their terminal ends 14a, 16a. The Mach-Zehnder interferometers 19, 20, 21 are formed in the straight segments.

The terminal ends 14a, 16a of the second and third optical waveguides 14 and 16 are optically coupled to the curved optical waveguide 22 so that the second and third optical waveguides 14 and 16 and the curved optical waveguide 22 form a first loop optical waveguide 32. The curved optical waveguide 22 is a silicon waveguide similar to the second and third optical waveguides 14 and 16 and has the same cross sectional dimensions. In the present embodiment the curved optical waveguide 22 is integral with the second and third optical waveguides 14 and 16, forming a curved continuation of the second and third optical waveguides 14 and 16.

In plan view the curved optical waveguide 22 has, for example, a semicircular shape. The radius of curvature of the curved optical waveguide 22 should be large enough to hold the loss of light propagating in the curved optical waveguide 22 to an acceptable level. In the present embodiment, in which the curved optical waveguide 22 is a silicon waveguide embedded in a silicon dioxide cladding, the radius of curvature of the curved optical waveguide 22 may be, for example, about 0.3 mm.

Referring to FIG. 3, the first Mach-Zehnder interferometer 19 comprises a pair of Y-branches 19a, 19b joined by two straight arms 19c, 19d. An electrode 19e is provided on arm 19c.

The two arms 19c, 19d have different optical path lengths L19c and L19d. The arm 19c with the electrode 19e has the shorter optical path length (L19c<L19d). The difference (L19d-L19c) between the two optical path lengths will be denoted ΔL1. The length of the electrode 19e on arm 19c will be denoted Le1.

When a voltage is applied to the electrode 19e, the refractive index of arm 19c changes due to thermo-optic and electro-optic effects. The optical path length of arm 19c is thereby controlled by the voltage applied to the electrode 19e; this feature is used for wavelength tuning.

Light entering the first Mach-Zehnder interferometer 19 at Y-branch 19a propagates through both arms 19c, 19d. When the light recombines at Y-branch 19b, a phase difference arises due to the difference ΔL1 in the optical path length of the two arms 19c, 19d. The recombining light may interfere constructively or destructively, depending on its wavelength and the value of ΔL1. This enables the first Mach-Zehnder interferometer 19 to operate as a means of wavelength selection.

The second and third Mach-Zehnder interferometers 20, 21 are similar to the first Mach-Zehnder interferometer 19, but have different lengths. The optical path length differences between their arms will be denoted ΔL2 and ΔL3, respectively. The lengths of their electrodes will be denoted Le2 and Le3, respectively. These values are related to the corresponding values ΔL1 and Le1 of the first Mach-Zehnder interferometer 19 by the following equations, in which the integer i takes values from one to three (i=1, 2, 3).

$$\Delta Li = \Delta L1 \times 2^{i-1}$$

$$Lei = Le1 \times 2^{i-1}$$

These equations can be generalized to the case of n Mach-Zehnder interferometers by allowing the integer i to take values from one to n. In each successive Mach-Zehnder interferometer, the electrode length and the optical path length difference are doubled. In the present example, Le2 and ΔL2 are twice Le1 and ΔL1, respectively, and Le3 and ΔL3 are equal to four times Le1 and ΔL1, respectively.

Next, the operation of the first embodiment will be described.

Light generated in the semiconductor optical amplifier 26 propagates through the first optical waveguide 12 to the branching point P of the Y-branched waveguide 18, and is divided equally between the second optical waveguide 14 and third optical waveguide 16.

The light that enters the second optical waveguide 14 undergoes wavelength selection in the first and second Mach-Zehnder interferometers 19, 20. The wavelength selection mechanism will be described in more detail later. Light of wavelengths rejected by these Mach-Zehnder interferometers 19, 20 is dissipated in the silicon dioxide cladding film 30.

The light that passes through the first and second Mach-Zehnder interferometers 19, 20 proceeds through the curved optical waveguide 22, which changes its direction of travel by 180 degrees, and enters the third optical waveguide 16. The Mach-Zehnder interferometer 21 in the third optical waveguide 16 performs a further wavelength selection process.

Similarly, light that enters the third optical waveguide 16 from point P undergoes wavelength selection in the third Mach-Zehnder interferometer 21, then travels around the curved optical waveguide 22, enters the second optical waveguide 14, and undergoes further wavelength selection in the first and second Mach-Zehnder interferometers 19, 20.

Accordingly, the light emitted in the semiconductor optical amplifier 26 that reaches point P through the first optical waveguide 12 is divided into two equal parts that travel around the first loop optical waveguide 32 in the clockwise direction (third optical waveguide 16 to curved optical waveguide 22 to second optical waveguide 14) and counterclockwise direction (second optical waveguide 14 to curved optical waveguide 22 to third optical waveguide 16), respectively, then recombine at point P. Since both parts of the light traverse the same optical path, albeit in opposite directions, when they return to point P they are mutually in phase and recombine constructively; no light is lost by destructive interference.

The recombined light propagates through the first optical waveguide 12 and semiconductor optical amplifier 26 to the reflector 24, where most of the light is reflected back through the semiconductor optical amplifier 26 to repeat the process described above, again and again. The light is amplified in each repetition. In the steady state, amplification in the semiconductor optical amplifier 26 is balanced by loss in the waveguides and by escape of some of the light through the reflector 24. The escaping light is emitted as a laser beam, indicated by the arrow at the left in FIG. 1.

The wavelength selection mechanism will now be described in more detail with reference to the graphs in FIGS. 4A to 4C. In each graph, the horizontal axis represents wavelength and the vertical axis represents light intensity, both in arbitrary units.

Figure 4:
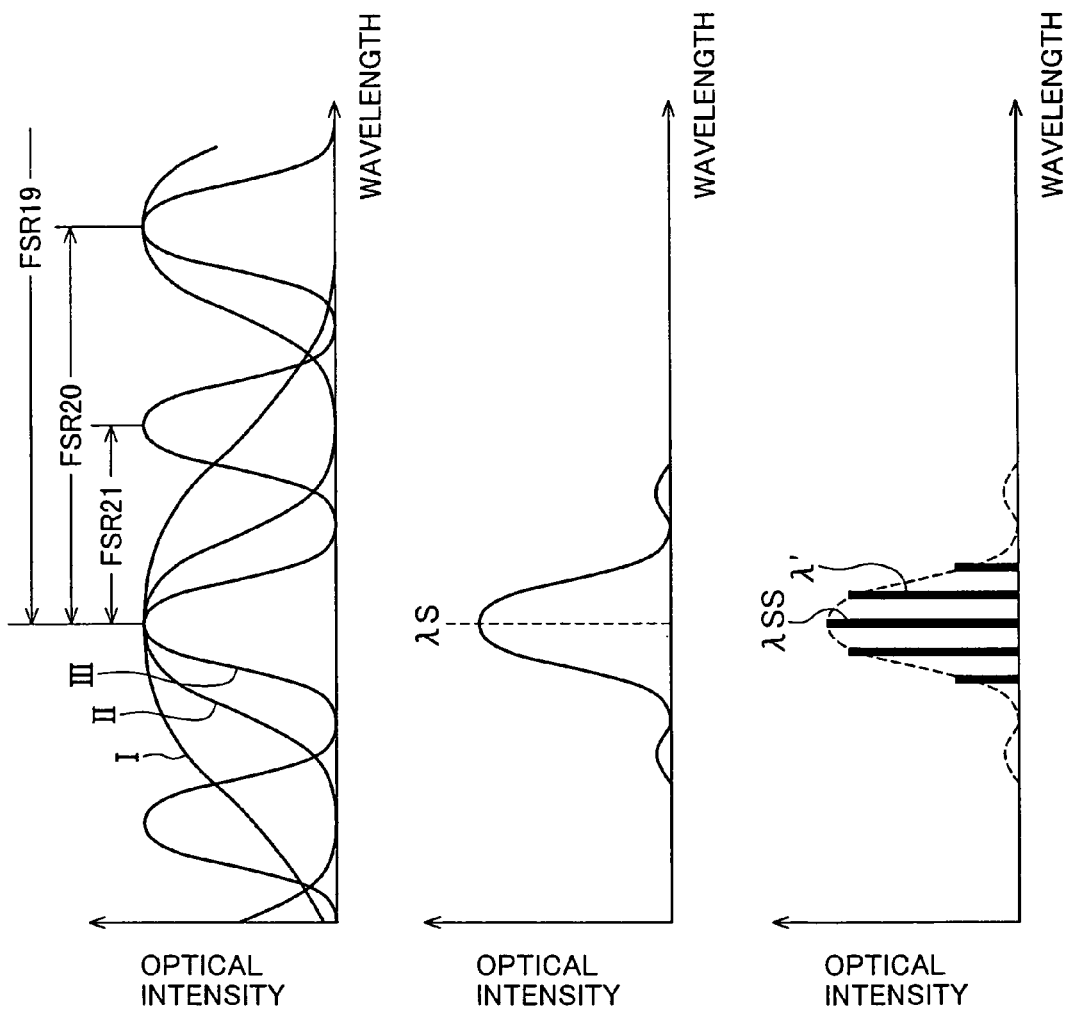
FIG. 4A is a graph schematically depicting the wavelength selection characteristics of the three Mach-Zehnder interferometers in FIG. 1.
FIG. 4B is a graph schematically depicting the combined wavelength selection characteristic of the three Mach-Zehnder interferometers in FIG. 1.
FIG. 4C is a schematic redrawing of FIG. 4B, also indicating the Fabry-Perot resonant wavelengths.

FIG. 4A schematically illustrates the wavelength selectivity characteristics of the three Mach-Zehnder interferometers 19, 20, 21. Curve I represents the wavelength selectivity of the first Mach-Zehnder interferometer 19 when white light including all wavelengths enters at Y-branch 19a and exits at Y-branch 19b. Similarly, curve II represents the wavelength selectivity of the second Mach-Zehnder interferometer 20 when white light including all wavelengths enters at Y-branch 20a and exits at Y-branch 20b, and curve III represents the wavelength selectivity of the third Mach-Zehnder interferometer 21 when white light including all wavelengths enters at Y-branch 21a and exits at Y-branch 21b.

All three selectivity curves I, II, III are periodic. Their peak-to-peak distances, referred to as their free spectral ranges, decrease with increasing arm length. Thus the free spectral range FRS19 of the first Mach-Zehnder interferometer 19 is greater than the free spectral range FRS20 of the second Mach-Zehnder interferometer 20, which is in turn greater than the free spectral range FRS21 of the third Mach-Zehnder interferometer 21.

In general, the free spectral range (FSR) of a Mach-Zehnder interferometer is given by the following equation (1), $$FSR = \lambda^2 / (2ns\Delta L) \qquad (1)$$

where ns is the refractive index of the material of the Mach-Zehnder interferometer, $\Delta L$ is the optical path length difference between the two arms, and $\lambda$ is the wavelength of the light. For a given refractive index and wavelength, a doubling of the path length difference $\Delta L$ reduces the free spectral range by a factor of two. Since the three Mach-Zehnder interferometers 19, 20, 21 have successively doubling path length differences $\Delta L1$, $\Delta L2$, $\Delta L3$, their free spectral ranges are related as follows: FSR19/4=FSR20/2=FSR21.

The three wavelength selectivity curves I, II, III in FIG. 4A have a common peak at a wavelength denoted $\lambda S$ in FIG. 4B. FIG. 4B schematically shows the combined wavelength selectivity curve of the three Mach-Zehnder interferometers 19, 20, 21, obtained by multiplying the three curves I, II, III together. In the vicinity of wavelength $\lambda S$, the multiple peaks of varying widths in FIG. 4A are reduced to substantially a single comparatively narrow peak in FIG. 4B.

The optical resonator 10 also operates as a type of Fabry-Perot resonator between the reflector 24 and the first loop optical waveguide 32, so the wavelengths of the light actually output from the optical resonator 10 are restricted to the longitudinal modes permitted by the Fabry-Perot resonator structure. These modes are indicated by vertical bars in FIG. 4C. The bar height is limited by the combined selectivity curve in FIG. 4B, indicated as a dotted line in FIG. 4C. The wavelength $\lambda SS$ that experiences the least loss in the optical resonator 10 represents the permitted longitudinal mode closest to the peak wavelength $\lambda S$ in FIG. 4B; light of this wavelength is emitted most strongly from the optical resonator 10. Additional side modes, represented by lower vertical bars in FIG. 4C, also generate some light emission.

The sharpness of the wavelength selectivity of the optical resonator 10 can be represented by the side mode suppression ratio R, which is the ratio of the emitted power of the light with wavelength $\lambda SS$ to the emitted power of the nearest side mode $\lambda'$.

Figure 5:
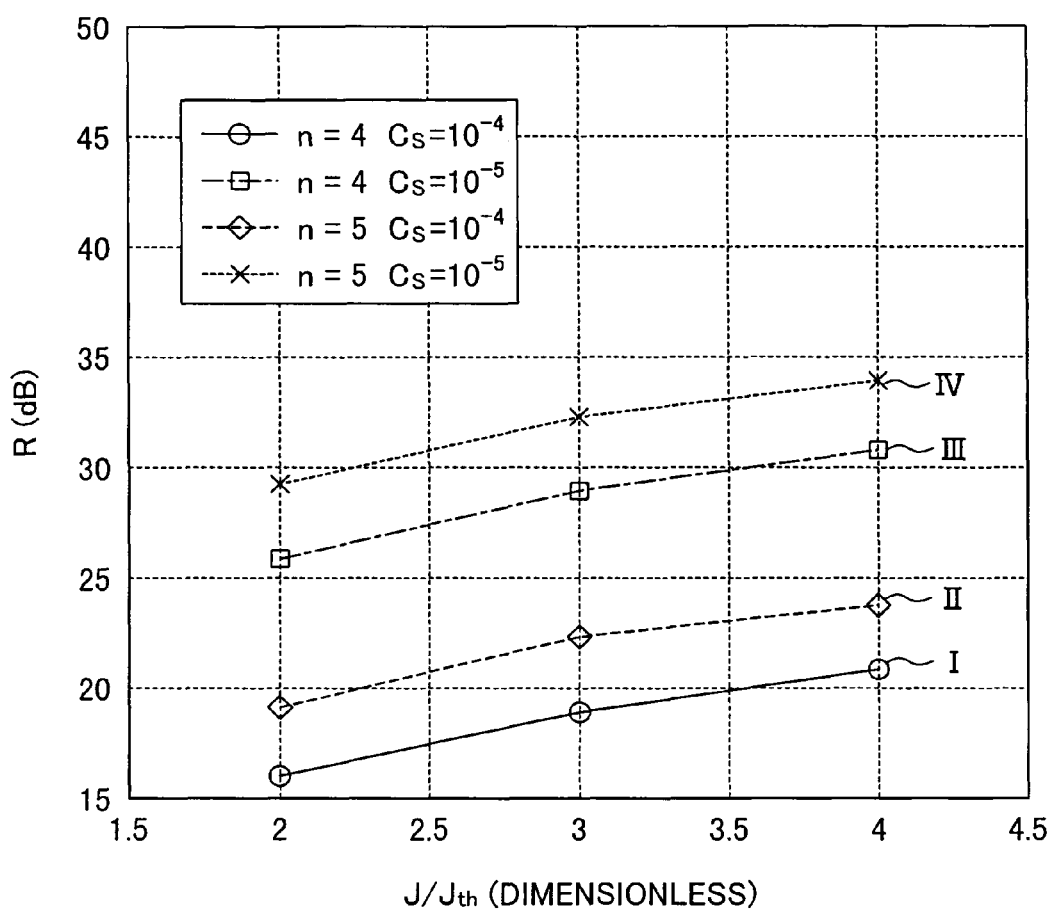
FIG. 5 is a graph illustrating side mode suppression characteristics in several versions of the first embodiment.

Referring to FIG. 5, the side mode suppression ratio R (shown in decibels on the vertical axis) depends on the current density J in the semiconductor optical amplifier 26. The horizontal axis in FIG. 5 represents the current density J normalized with respect to the threshold current $J_{th}$ at which light emission begins, so that the value of $J/J_{th}$ on the horizontal axis is dimensionless.

The side mode suppression ratio R also depends on the number n of Mach-Zehnder interferometers in the optical resonator 10, and the spontaneous emission coupling coefficient Cs of the semiconductor optical amplifier 26, which is determined by the structure and composition of the semiconductor optical amplifier 26. Four curves I-IV are shown, representing different combinations of n (4 or 5) and Cs ($10^{-4}$ or $10^{-5}$). These curves were derived under the assumption that the length of the semiconductor optical amplifier 26 in the direction of light propagation was 0.3 mm.

A comparison of curve I with curve III and curve II with curve IV in FIG. 5 shows that for the same spontaneous emission coupling coefficient Cs, increasing the number n of Mach-Zehnder interferometers increases the side mode suppression ratio R.

Ordinarily, if the number n of Mach-Zehnder interferometers is increased, since the optical path length of the optical resonator 10 is increased, the wavelength spacing between the longitudinal modes in decreased and the side mode suppression ratio is decreased accordingly. As FIG. shows, however, increasing the number n of Mach-Zehnder interferometers in the present embodiment improves the side mode suppression ratio R, indicating that the narrower spacing between longitudinal modes is offset by an even greater narrowing of the combined wavelength selectivity peak.

A side mode suppression ratio R of at least thirty decibels (30 dB) is generally held to be desirable. As indicated by curve IV in FIG. 5, this value is attained or exceeded, over virtually the entire normalized current density ($J/J_{th}$) range from two to four, when the spontaneous emission coupling coefficient Cs is $10^{-5}$ and there are five Mach-Zehnder interferometers.

Next the wavelength tuning mechanism by which the selected wavelength is varied will be described.

It is known that the wavelength selectivity of a Mach-Zehnder interferometer can be changed by an amount $\Delta\lambda$ by changing its refractive index ns by an amount $\Delta ns$, where $\Delta\lambda$ and $\Delta ns$ are related by the following equation (2), in which Le is the electrode length of the Mach-Zehnder interferometer and $\Delta L$ is the optical path length difference of its arms as above.

$$\Delta\lambda=\lambda\Delta nsLe/(-ns\Delta L) \qquad (2)$$

Because the ratio $Le/\Delta L$ is the same for all the Mach-Zehnder interferometers in the present embodiment, if all of the Mach-Zehnder interferometers have the same refractive index ns, their individual wavelength selectivity curves can be shifted by the same amount $\Delta\lambda$ by changing their refractive indexes by the same amount $\Delta ns$. That is, the optical resonator 10 can be tuned by controlling a single refractive index parameter.

Exemplary dimensions for the optical resonator 10 can be calculated as follows.

If, for example, tunability over a wavelength range $\Delta\lambda$ of 50 nm is required, then to avoid extraneous peaks in this wavelength range, the free spectral range must be at least 50 nm. If the Mach-Zehnder interferometers 19, 20, 21 are assumed to be silicon structures with a refractive index of about three (ns≈3), and if the wavelength $\lambda$ is assumed to be 1.55 µm, a wavelength which is often used in optical communications, then equation (1) shows that the optical path length difference should be at least about 8 µm.

If the maximum change $\Delta ns$ in the refractive index is assumed to be about 0.01, which is a typical value for silicon, then equation (2) indicates an electrode length of about 80 µm, and the first loop optical waveguide 32 can be reduced to a dimension of about 1.5 mm.

The change $\Delta ns$ in the refractive index is obtained by varying the voltage applied to the electrodes 19e, 20e, 21e of the Mach-Zehnder interferometers 19, 20, 21. The wavelength at which the optical resonator 10 operates can be controlled by varying a single voltage.

If the electrode lengths of the Mach-Zehnder interferometers have successively doubling ratios as in the description above, then the length of the longest Mach-Zehnder interferometer is approximately equal to the sum of the lengths of the other Mach-Zehnder interferometers. If the longest Mach-Zehnder interferometer is placed in the third optical waveguide 16 and the other Mach-Zehnder interferometers are placed in the second optical waveguide 14 as in FIG. 1, then the necessary length of the second and third optical waveguides 14, 16 is only the length necessary to accommodate the longest Mach-Zehnder interferometer. The total length of the optical resonator 10 is accordingly only about half the length that would be necessary if all of the Mach-Zehnder interferometers were to be placed in a single linear waveguide, and the dimensions of the optical resonator 10 can be much smaller than the dimensions of the tunable laser described by Takahashi et al.

Figure 6:
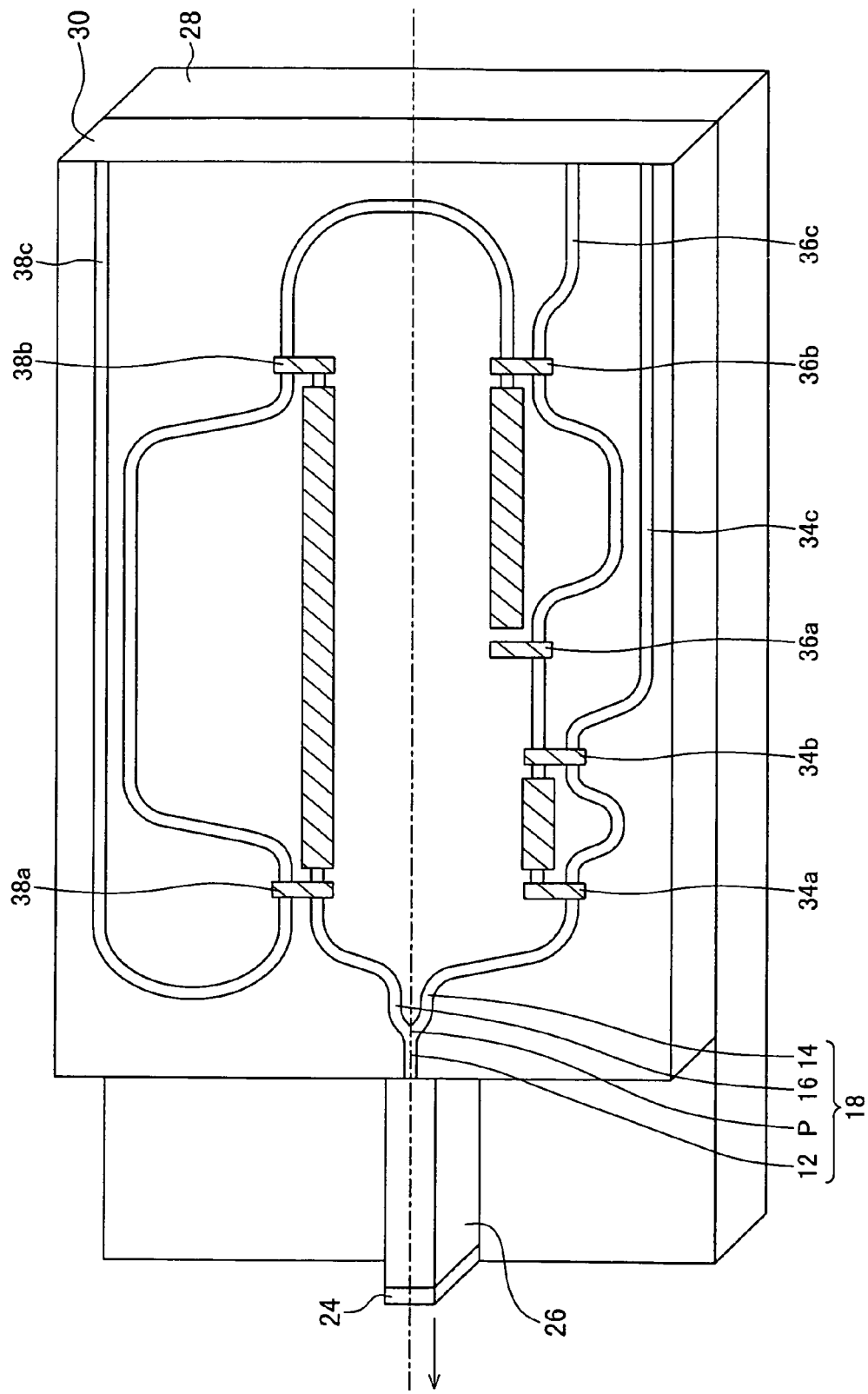
FIG. 6 is a schematic perspective view of an optical resonator in a variation of the first embodiment of the invention.

In a variation of the first embodiment, the Y-branches 19a, 19b, 20a, 20b, 21a, 21b of the Mach-Zehnder interferometers in FIG. 1 are replaced by two-by-two optical couplers 34a, 34b, 36a, 36b, 38a, 38b as shown in FIG. 6. Multi-mode interference couplers or directional couplers may be used. This variation permits one of the arms in each Mach-Zehnder interferometer to be extended beyond one of the couplers. The extended arm waveguides function as optical exit waveguides 34c, 36c, 38c that lead unwanted light to the exterior of the optical resonator device. The light led out through the optical exit waveguides 34c, 36c, 38c can be monitored to verify the wavelengths selected by the Mach-Zehnder interferometers.

This variation also applies to the second embodiment, which is described next.

Second Embodiment

Figure 7:
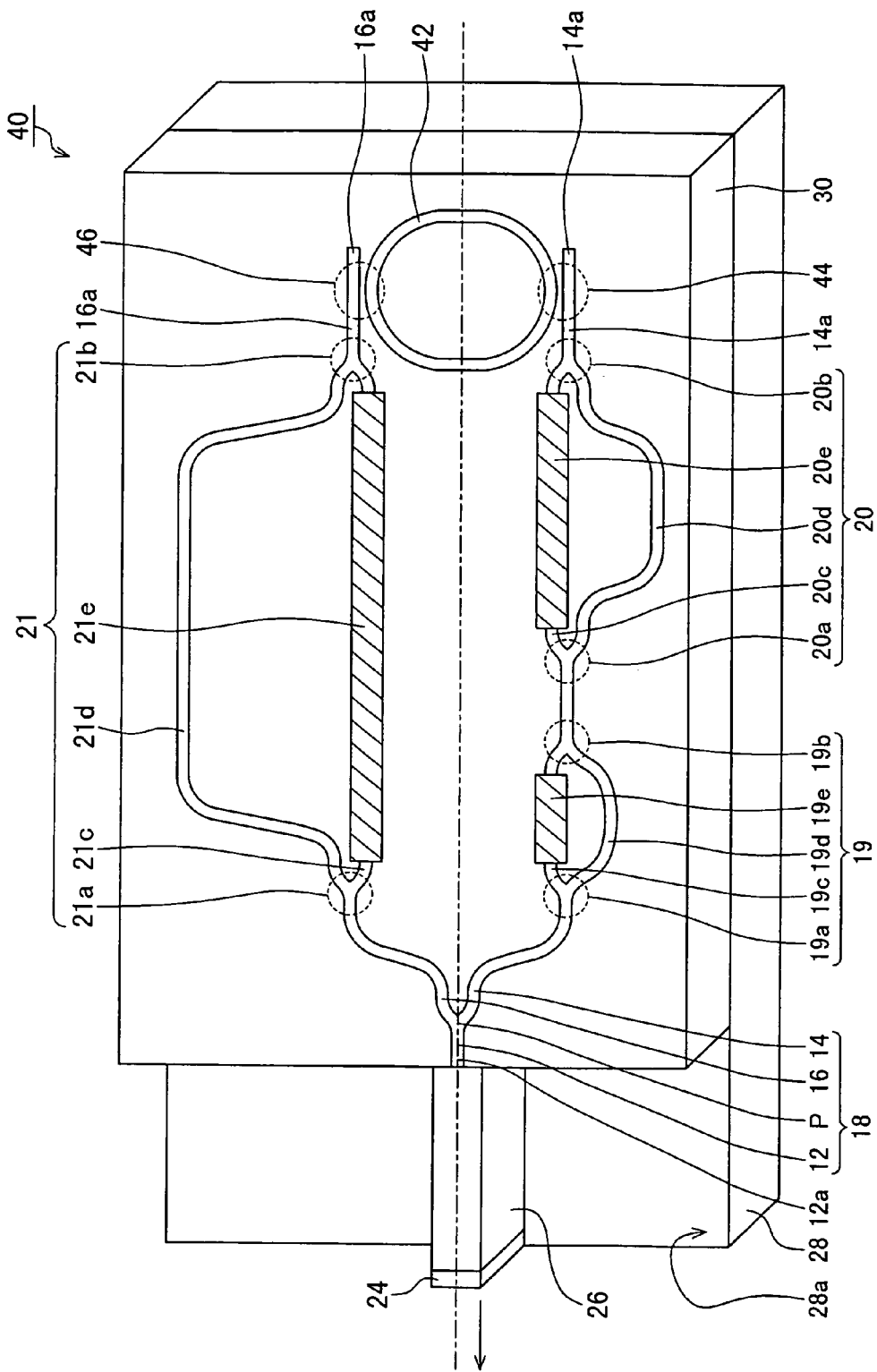
FIG. 7 is a schematic perspective view of an optical resonator in a second embodiment of the invention.

Referring to FIG. 7, the second embodiment replaces the curved optical waveguide that joined the terminal ends 14a, 16a of the second and third optical waveguides 14, 16 in the first embodiment with a second loop optical waveguide 42. Other than this difference, the optical resonator 40 in FIG. 7 is identical to the optical resonator in the first embodiment.

Although the second loop optical waveguide 42 is not physically joined to the terminal ends 14a, 16a of the second and third optical waveguides 14, 16, the second loop optical waveguide 42 approaches the terminal ends 14a, 16a of the second and third optical waveguides 14, 16 closely enough for an optical coupling to be obtained. The regions of close approach between the second loop optical waveguide 42 and the terminal ends 14a, 16a of the second and third optical waveguides 14, 16 form a pair of directional couplers 44, 46.

The second loop optical waveguide 42 itself forms a non-terminated substantially circular optical ring resonator embedded in the silicon dioxide cladding film 30 between the terminal ends 14a, 16a of the second and third optical waveguides 14, 16. The second loop optical waveguide 42 is preferably a silicon waveguide with the same cross-sectional dimensions as the second and third optical waveguides 14, 16. The radius of curvature of the second loop optical waveguide 42 may be selected according to the operating wavelength range of the optical resonator 40; one preferred value for the radius of curvature is approximately 0.3 mm.

As in the first embodiment, light emitted in the semiconductor optical amplifier 26 toward the first optical waveguide 12 is divided at point P into two equal parts. The part that propagates through the second optical waveguide 14 undergoes wavelength selection by the first and second Mach-Zehnder interferometers 19, 20. Light of the selected wavelengths is coupled into the second loop optical waveguide 42 by directional coupler 44 and begins circulating around the second loop optical waveguide 42. After making one complete circuit of the second loop optical waveguide 42, the light interferes with further light entering the second loop optical waveguide 42 from the 14a of the second optical waveguide 14. Depending on the wavelength of the light, the interference may be constructive or destructive. Light of wavelengths that satisfy the resonance condition of the second loop optical waveguide 42 interferes constructively and increases in intensity as it circulates repeatedly around the second loop optical waveguide 42. Light of other wavelengths is dissipated into the silicon dioxide cladding film 30.

Of the light that satisfies the resonance condition of the second loop optical waveguide 42 and continues to circulate in the second loop optical waveguide 42, a fraction is coupled by directional coupler 46 into the third optical waveguide 16 and propagates back to point P, undergoing further wavelength selection in the third Mach-Zehnder interferometer 21. At point P this light recombines with light that has propagated in the opposite direction, from the third optical waveguide 16 through directional coupler 46 into the second loop optical waveguide 42, then from the second loop optical waveguide 42 through directional coupler 44 into the second optical waveguide 14 and back to point P. As in the first embodiment, the recombination is constructive because both parts of the light have traveled over the same path length in the second and third optical waveguides 14, 16 and because both parts satisfy the condition for resonance in the second loop optical waveguide 42.

Figure 8A:
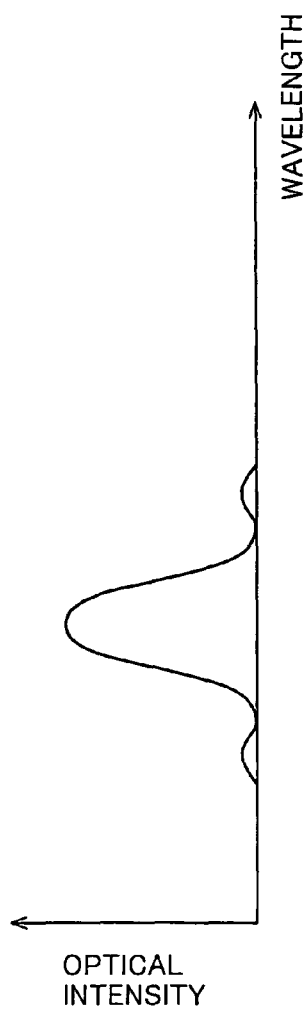
FIG. 8A is a graph schematically depicting the combined wavelength selection characteristic of the three Mach-Zehnder interferometers in FIG. 7.
Figure 8B:
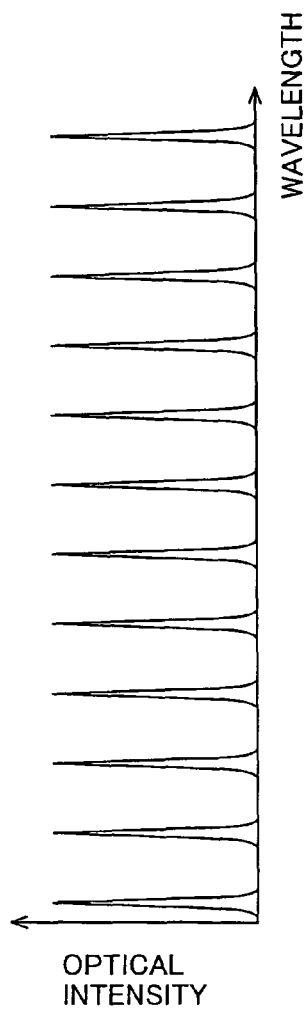
FIG. 8B is a graph schematically depicting the wavelength selection characteristic of the loop optical waveguide in FIG. 7.
Figure 8C:
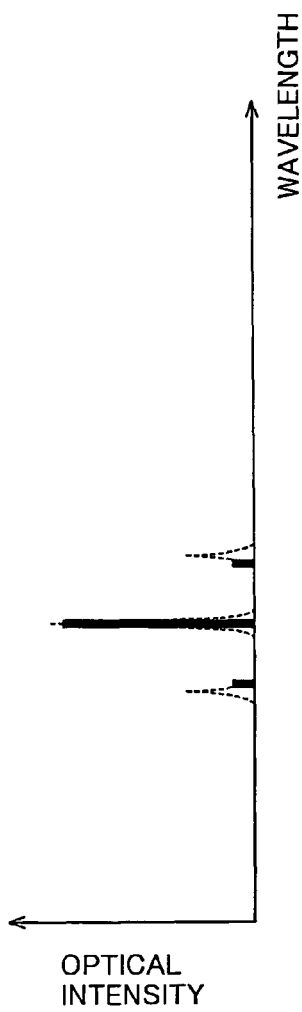
FIG. 8C is a graph schematically depicting the combined wavelength selection characteristic of the three Mach-Zehnder interferometers and the loop optical waveguide in FIG. 7.

The wavelength selection mechanism in the second embodiment is illustrated by the graphs in FIGS. 8A, 8B, and 8C, which indicate wavelength on the horizontal axis and optical intensity on the vertical axis, both in arbitrary units. The wavelength selection mechanism in the second embodiment differs from the wavelength selection mechanism in the first embodiment in that the second loop optical waveguide 42 is also involved. FIG. 8A (identical to FIG. 4B) illustrates the combined wavelength selectivity characteristic of the three Mach-Zehnder interferometers 19, 20, 21. FIG. 8B illustrates the wavelength selectivity characteristic of the second loop optical waveguide 42. The equally spaced peaks represent wavelengths that satisfy the resonance condition in the second loop optical waveguide 42. The dotted line in FIG. 8C represents the combination of the wavelength selectivity characteristics in FIGS. 8A and 8B. The vertical bars in FIG. 8C represent the permitted longitudinal modes of the optical resonator 40 and indicate the degrees to which they are selected.

Figure 9:
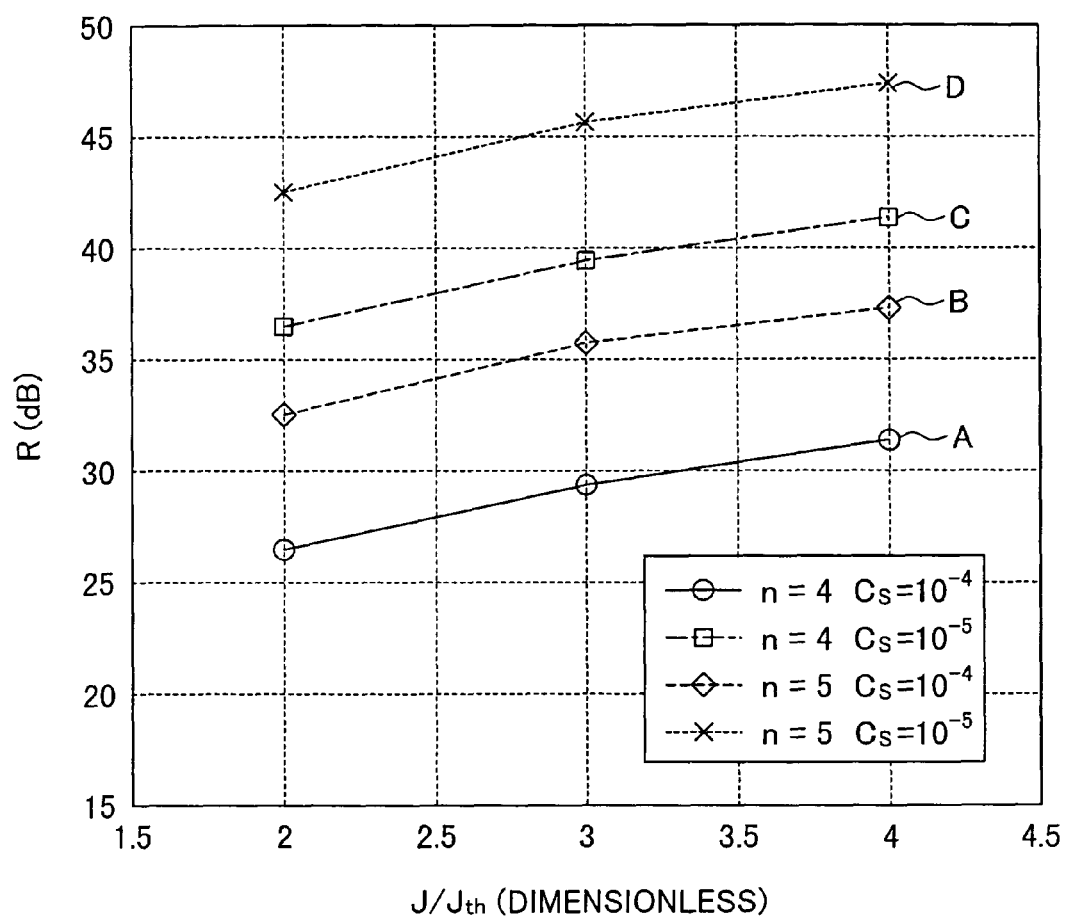
FIG. 9 is a graph illustrating side mode suppression characteristics in several versions of the second embodiment.

A comparison of FIG. 8C with FIG. 4C shows that the second embodiment has a much higher side mode suppression ratio than the second embodiment. The side mode suppression ratio R in the second embodiment is shown in FIG. 9 for the same combinations of the number n of Mach-Zehnder interferometers and the spontaneous emission coupling coefficient Cs and normalized current density values $J/J_{th}$ as in the first embodiment. Compared with the first embodiment (FIG. 5), there is an improvement of ten to fifteen decibels for all combinations of n, Cs, and $J/J_{th}$.

In terms of reduced resonator size and ease of tuning, the second embodiment provides substantially the same effect as the first embodiment, but the second embodiment offers considerably better wavelength selectivity.

It should be noted, however, that the light output from the optical resonator 40 in the second embodiment is limited to wavelengths that satisfy the resonance condition of the second loop optical waveguide 42.

In both of the preceding embodiments, Mach-Zehnder interferometers are used for wavelength selection in the second and third optical waveguides 14, 16, but the use of other types of tunable wavelength selectors is also contemplated.

The optical resonators in the preceding embodiments operate as lasers, but the optical amplifier 26 may be removed if only operation as a resonator is required. In this case the reflector 24 may be replaced by a reflector directly facing the terminal end 12a of the first optical waveguide 12.

Those skilled in the art will recognize that further variations are possible within the scope of the invention, which is defined in the appended claims.

What is claimed is:
1. An optical resonator comprising:
a Y-branched waveguide including first, second, and third optical waveguides with respective initial ends and respective terminal ends, the respective initial ends being interconnected at a single point, each of the second and third optical waveguides including at least one wavelength selector;
a reflector facing the terminal end of the first optical waveguide; and
an optical connecting path coupling the terminal end of the second optical waveguide to the terminal end of the third optical waveguide,
the optical connecting path including a loop optical waveguide optically coupled to the terminal end of the second optical waveguide and the terminal end of the third optical waveguide,
the loop optical waveguide including a first part disposed adjacent to the terminal end of the second optical waveguide to form a directional optical coupling with the second optical waveguide, and a second part disposed adjacent to the terminal end of the third optical waveguide to form a directional optical coupling with the third optical waveguide,
wherein the at least one wavelength selector comprises n Mach-Zehnder interferometers, n being an integer greater than two, each one of the n Mach-Zehnder interferometers having two arms, the two arms of the i-th one of the n Mach-Zehnder interferometers differing in optical path length by a quantity $\Delta Li$ (i varying from 1 to n), one of the two arms of the i-th one of the n Mach-Zehnder interferometers having an electrode of length $Lei$, the quantities $\Delta Li$ and $Lei$ doubling in each successive Mach-Zehnder interferometer, so that:

$$\Delta Li = \Delta L1 \times 2^{i-1}$$

$$Lei = Le1 \times 2^{i-1},$$

wherein the first n−1 ones of the n Mach-Zehnder interferometers are disposed on the second optical waveguide and the n-th one of the n Mach-Zehnder interferometers is disposed on the third optical waveguide.

2. The optical resonator of claim 1, further comprising a cladding, wherein the Y-branched waveguide and the optical connecting path are embedded in the cladding.

3. The optical resonator of claim 2, wherein the cladding is made of silicon dioxide and the Y-branched waveguide is made of silicon.

4. A tunable laser comprising the optical resonator of claim 1 and an optical amplifier inserted between the terminal end of the first optical waveguide and the reflector.

5. The tunable laser of claim 4, wherein the reflector comprises a reflective coating disposed on the optical amplifier.

6. The tunable laser of claim 4, further comprising:
a substrate on which the optical amplifier is disposed; and
a cladding disposed on the substrate, the Y-branched waveguide and the optical connecting path being embedded in the cladding.

7. The tunable laser of claim 6, wherein the cladding is made of silicon dioxide and the Y-branched waveguide is made of silicon.

8. The tunable laser of claim 6, wherein the substrate is made of silicon and the optical amplifier includes a layer of a compound semiconductor material.

9. The optical resonator of claim 1, wherein n is three,
the first Mach-Zehnder interferometer has two arms differing in optical path length by a quantity $\Delta L1$, one of the two arms of the first Mach-Zehnder interferometer having a first electrode with a length $Le1$,
the second Mach-Zehnder interferometer has two arms differing in optical path length by a quantity $\Delta L1 \times 2$, one of the two arms of the second Mach-Zehnder interferometer having a second electrode with a length $Le1 \times 2$, and
the third Mach-Zehnder interferometer has two arms differing in optical path length by a quantity $\Delta L1 \times 4$, one of the two arms of the third Mach-Zehnder interferometer having a third electrode with a length $Le1 \times 4$.

10. The optical resonator of claim 1, wherein the loop optical waveguide has a radius of curvature of approximately 0.3 mm.

11. The optical resonator of claim 1, wherein the loop optical waveguide has a radius of curvature corresponding to an operating wavelength of the optical resonator.

12. The optical resonator of claim 1, wherein the loop optical waveguide receives light via the directional optical coupling formed with the first part disposed adjacent to the terminal end of the second optical waveguide and the directional optical coupling formed with the second part disposed adjacent to the terminal end of the third optical waveguide.

* * * * *